(12) United States Patent
Killi et al.

(10) Patent No.: US 9,337,614 B1
(45) Date of Patent: May 10, 2016

(54) COOLING DISK LASERS

(71) Applicant: TRUMPF LASER GMBH, Schramberg (DE)

(72) Inventors: Alexander Killi, Trossingen (DE);
Klaus Wallmeroth, Zimmern o.R. (DE);
Thilo Vethake, Cranbury, NJ (US);
Vincent Kuhn, Schiltach (DE)

(73) Assignee: TRUMPF LASER GMBH, Schramberg (DE)

( * ) Notice: Subject to any disclaimer, the term of this patent is extended or adjusted under 35 U.S.C. 154(b) by 3 days.

(21) Appl. No.: 14/520,592

(22) Filed: Oct. 22, 2014

(51) Int. Cl.
H01S 5/024 (2006.01)

(52) U.S. Cl.
CPC ............. *H01S 5/024* (2013.01); *H01S 5/02407* (2013.01); *H01S 5/02423* (2013.01); *H01S 5/0243* (2013.01); *H01S 5/02446* (2013.01); *H01S 5/02469* (2013.01); *H01S 5/02476* (2013.01)

(58) Field of Classification Search
CPC . H01S 5/024; H01S 5/02407; H01S 5/02423; H01S 5/0243; H01S 5/02446; H01S 5/02469; H01S 5/02476
See application file for complete search history.

(56) References Cited

U.S. PATENT DOCUMENTS

| | | | |
|---|---|---|---|
| 5,641,400 A * | 6/1997 | Kaltenbach et al. | 210/198.2 |
| 6,339,605 B1 * | 1/2002 | Vetrovec | 372/35 |
| 7,593,447 B2 | 9/2009 | Basu | |
| 8,213,471 B2 | 7/2012 | Schlie et al. | |
| 8,379,680 B1 | 2/2013 | Sumida | |
| 8,509,273 B2 | 8/2013 | Schlie et al. | |
| 2005/0074040 A1 | 4/2005 | Spence et al. | |
| 2006/0209918 A1 | 9/2006 | Wang et al. | |
| 2009/0016398 A1 * | 1/2009 | Lorenzen et al. | 372/50.12 |
| 2012/0065711 A1 * | 3/2012 | Netchitailo et al. | 607/88 |
| 2012/0177073 A1 * | 7/2012 | Stephens et al. | 372/35 |

FOREIGN PATENT DOCUMENTS

| CN | 102386554 A | 3/2012 |
|---|---|---|
| JP | 7140362 A | 6/1995 |

* cited by examiner

*Primary Examiner* — Xinning Niu
(74) *Attorney, Agent, or Firm* — Fish & Richardson P.C.

(57) ABSTRACT

A laser disk module includes a lasing element including an active gain medium, the lasing element including opposite top and bottom end surfaces, and a heat transfer element adjacent the bottom end surface, the heat transfer element including a ceramic material that defines a plurality of cooling structures. The heat transfer element is configured to transfer heat generated in the lasing element to a coolant in contact with the heat transfer element in the plurality of cooling structures during operation of the laser disk module.

18 Claims, 4 Drawing Sheets

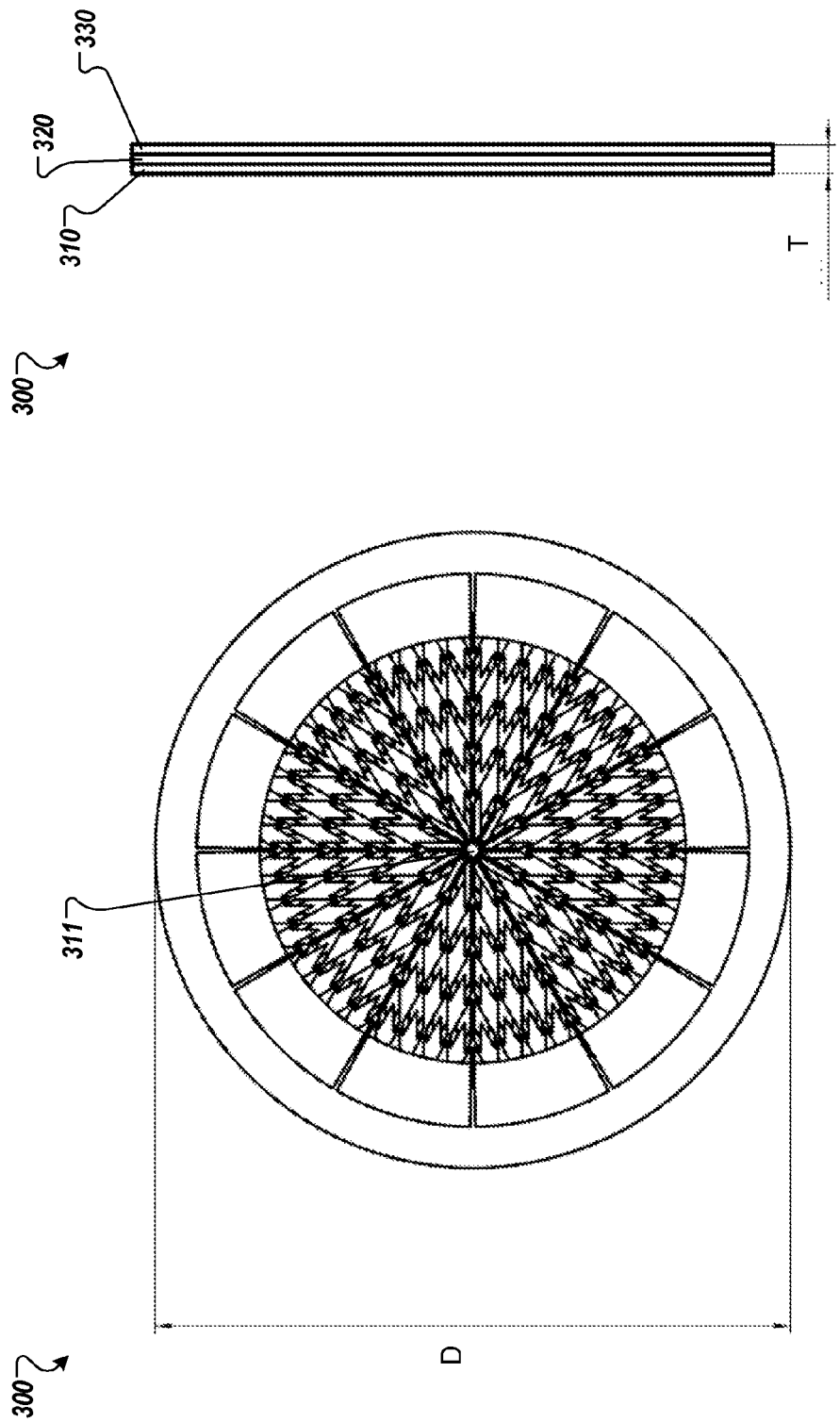

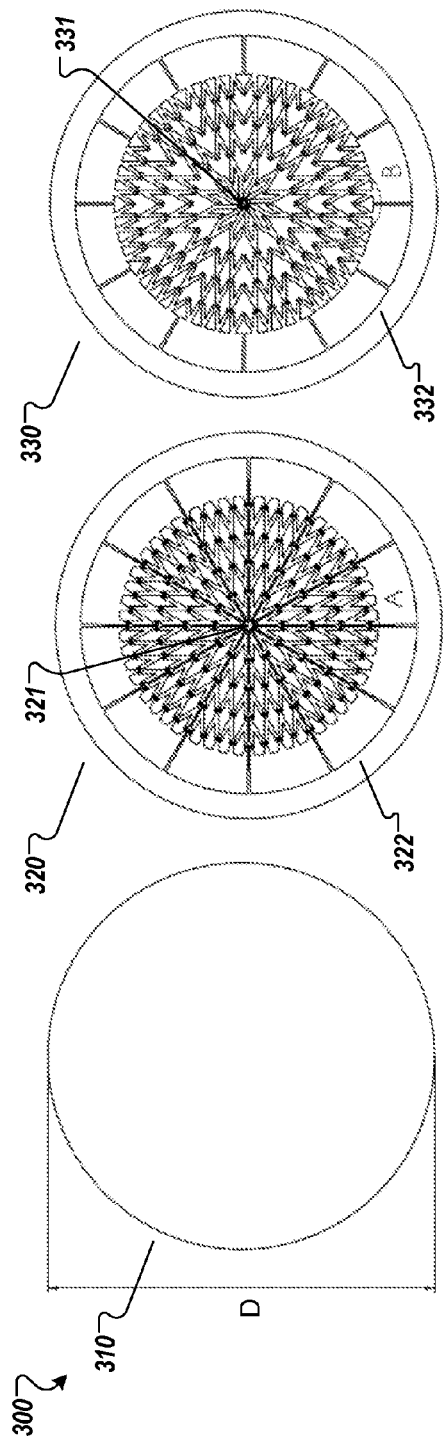
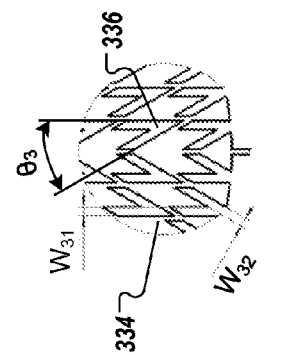
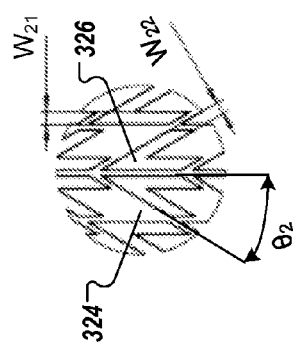
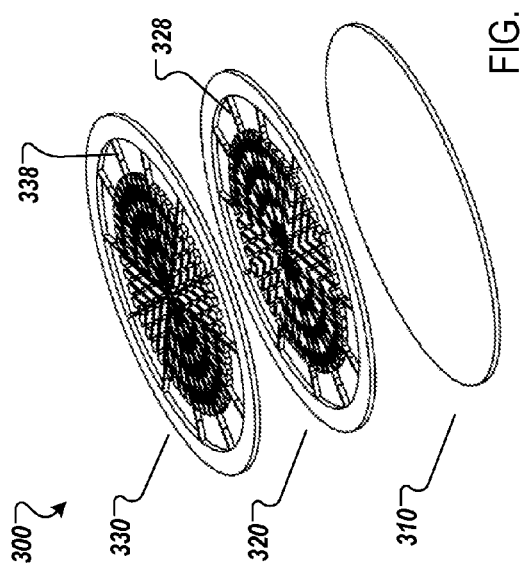
FIG. 3C
FIG. 3E
FIG. 3F
FIG. 3D

COOLING DISK LASERS

TECHNICAL FIELD

This specification relates to laser systems, and particularly to laser disk modules including heat transfer elements.

BACKGROUND

A disk laser, particularly a thin disk laser, is a laser whose active gain medium is a thin crystal disk. For example, a ytterbium (Yb) doped yttrium aluminum garnet (YAG) disk laser can include a Yb:YAG or Yb:LuAG crystal disk with a thickness of about 100-200 μm. Cooling is typically required for the thin crystal disk. A metal disk, e.g., made of cooper with a thermal conductivity of about 400 W/(m·K), can be used to build a heat sink to provide the cooling for the thin crystal disk during operation of the disk laser. In some cases, a high-power disk laser can have much higher cooling requirement than what a metal disk can provide. Diamond has a higher thermal conductivity, e.g., about 2000 W/(m·K), than cooper, and a diamond disk can be used to provide the cooling for the high-power disk laser. However, due to dissimilar thermal expansion coefficients between the diamond and the active gain medium of the crystal disk, the diamond disk is hard to be thermally expansion matched to the crystal disk. The diamond disk is also expensive to be used for disk lasers.

SUMMARY

This specification describes a laser disk module including a heat transfer element coupled to a laser crystal disk for cooling. The laser disk module can be combined with other laser arrangements such as external mirrors or imaging optics to form a disk laser or a semiconductor laser. The heat transfer element is made of a ceramic material such as aluminum nitride (AlN) and provides a number of cooling structures such as microchannels or microstructures. The heat transfer element can effectively transfer heat generated in the laser crystal disk to a coolant in the cooling structures and enable high performance and cost-effective cooling for the laser crystal disk.

In general, one innovative aspect of the subject matter described in this specification can be embodied in a laser disk module. The laser disk module includes a lasing element including an active gain medium, the lasing element including opposite top and bottom end surfaces; and a heat transfer element adjacent the bottom end surface, the heat transfer element including a ceramic material that defines a plurality of cooling structures. The heat transfer element is configured to transfer heat generated in the lasing element to a coolant in contact with the heat transfer element in the plurality of cooling structures during operation of the laser disk module.

In another general embodiment, a thin disk laser module includes a thin crystal disk of active gain medium, the thin crystal disk including opposite top and bottom end surfaces that define a thickness therebetween along a longitudinal direction substantially perpendicular to the bottom end surface; and a heat transfer element adjacent the thin crystal disk along the longitudinal direction, the heat transfer element being made of a ceramic material. The heat transfer element includes a heat transfer front side coupled to the bottom end surface of the thin crystal disk, the heat transfer front side including a solid plate; and a heat transfer back side including a plurality of cooling structures that are open to a bottom surface of the heat transfer front side along the longitudinal direction. The heat transfer element is configured to transfer heat generated in the thin crystal disk to a cooling fluid in a direct contact with the bottom surface of the heat transfer front side and with the heat transfer back side in the plurality of cooling structures during operation of the thin disk laser module.

The foregoing and other embodiments can each optionally include one or more of the following features, alone or in combination. For example, the bottom end surface of the lasing element is deposited with a high-reflectivity coating configured to form a laser cavity with an external reflective configuration positioned in front of the top bottom end surface, the laser cavity being part of a thin disk laser or a semiconductor laser. The active gain medium can include ytterbium doped yttrium aluminum garnet (Yb:YAG) or lutetium aluminum garnet (Yb:LuAG). The ceramic material can include aluminum nitride (AlN). In some cases, the heat transfer element has a thickness of between about 100 μm and 10 mm.

The plurality of cooling structures can have a total inner surface area substantially larger than an interaction area between the heat transfer element and the bottom end face of the lasing element. In some implementations, the plurality of cooling structures is radially distributed between a center of the heat transfer element and a peripheral edge of the heat transfer element, the cooling structures including a plurality of solid parts that define a plurality of channels. In some examples, each solid part has a rhombus shape defining an acute angle. In a particular example, the acute angle is about 22.5 degree defined by two adjacent sides of the solid part, and a channel width is about 0.2 mm defined by adjacent sides of the solid part and adjacent solid part. In some examples, each channel has one of an arrow shape defining an acute angle pointing to the center of the heat transfer element or an arrow shape defining an acute angle pointing to the peripheral edge of the heat transfer layer. In a particular example, each channel has an acute angle of about 22.5 degree defined by two adjacent sides of the channel and a channel width of about 0.2 mm defined by two parallel sides of the channel.

The laser disk module can further include a cooling cavity coupled to the heat transfer element, wherein, during the operation of the laser disk module, the coolant is circulated through a coolant supply conduit into the cooling cavity and into the cooling structures, and the heated coolant is circulated from the cooling structures to the cooling cavity to a coolant return conduit. The heat transfer element can be configured such that the coolant is micro-impinged onto the cooling structures in multiple jets, the heat being locally and radially transferred from the heat transfer element to the coolant. The heat transfer element can include a foam-like configuration that defines the plurality of cooling structures.

In some cases, the heat transfer element includes a heat transfer front side thermally coupled to the back end face of the lasing element and a heat transfer back side for interacting with the coolant, the plurality of cooling structures being within the heat transfer back side. The heat transfer front side and the back end face of the lasing element can be coupled together by at least one of bonding, soldering, welding, or mounting.

In some implementations, the heat transfer element includes a plurality of layers that forms the plurality of cooling structures when the layers are joint together. The plurality of layers can include: a first layer adjacent the back end face of the lasing element, the first layer being a solid plate; and a second layer adjacent the first layer, the second layer including a plurality of second channels that is radially distributed between a center of the second layer and a peripheral edge of the second layer. The plurality of layers can further include: a third layer adjacent the second layer, the third layer including a plurality of third channels that is radially distributed between a center of the third layer to a peripheral edge of the third layer, the third channels crossing over the second channels and being configured to permit the coolant to flow freely between the second channels and the third channels during the operation of the laser disk module. Each channel of the second channels can have a first arrow shape defining a first acute angle pointing to the center of the second layer, and each channel of the third channels has a second arrow shape defining a second acute angle pointing to the peripheral edge of the third layer, and the centers of the first, second and third layers can be coaxial and the first, second and third layers can have a substantially same diameter.

Particular embodiments of the subject matter described in this specification can be implemented to realize one or more advantages. First, a heat transfer element made of a ceramic material such as AlN can provide a number of cooling structures, e.g., microchannels or microstructures, that provide large surface area for interaction with a coolant, small coolant resistance for high coolant flow rate, and small thermal resistance for high heat transfer rate, which enables the heat transfer element to achieve high cooling power. Second, the ceramic material such as AlN has suitable properties in terms of thermal conductivity and mechanical stiffness, which ensures the heat transfer element to achieve high performance, e.g., in both cooling power and mechanical strength. Third, the ceramic material is softer than diamond and can be machined much easier and more precisely to specific shapes and surface specifications for the heat transfer element, which enables simple, flexible, accurate, cost-effective manufacturing. Fourth, the ceramic material is much cheaper than diamond, which can greatly reduce material cost. Fifth, the heat transfer element can be directly coupled to a laser crystal disk for cooling to form a laser disk module, which enables compact, integrated and efficient configurations for disk lasers. Sixth, the heat transfer element is compatible with conventional disk lasers and can be easily utilized in the disk lasers. The heat transfer element can be used not only for thin laser crystal disks but also for semiconductors, e.g., vertical external cavity surface-emitting lasers (VECSELs) or edge emitter lasers mediums.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTIONS OF DRAWINGS

FIG. 3A depicts another example heat transfer element with multiple channels.

FIG. 3B depicts a side view of the heat transfer element of FIG. 3A.

FIG. 3C depicts an exploded side view of layers of the heat transfer element of FIG. 3A.

FIG. 3D depicts an exploded perspective view of layers of the heat transfer element of FIG. 3A.

FIGS. 3E and 3F depict enlarged views of part of layers of the heat transfer layers of FIG. 3A.

Like reference numbers and designations in the various drawings indicate like elements.

DETAILED DESCRIPTION

Figure 1:
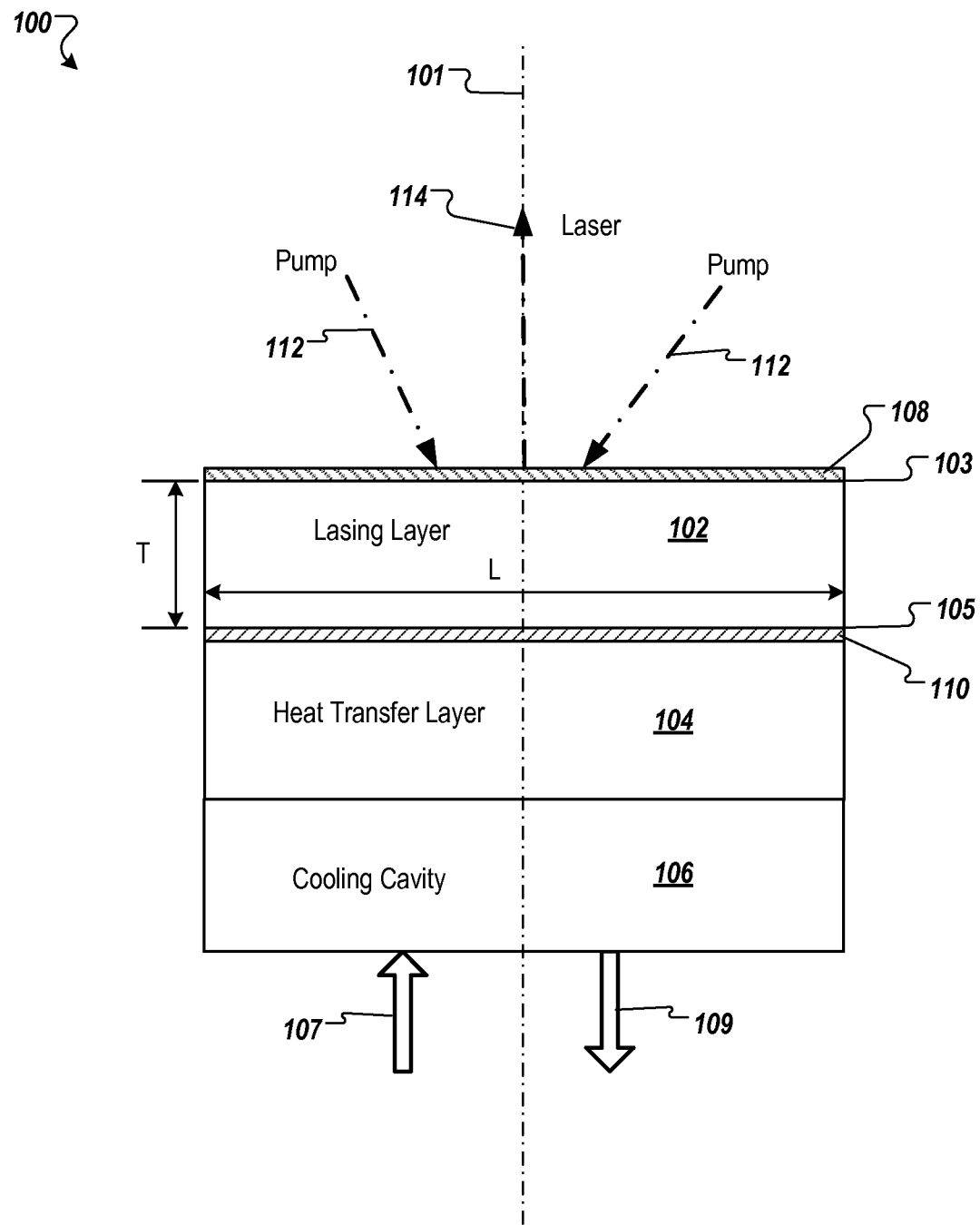
FIG. 1 is a schematic view of a laser disk module with a cooling configuration.

FIG. 1 shows a schematic view of a laser disk module 100 with a cooling configuration. The laser disk module 100 can be combined with other laser arrangements, e.g., external reflective mirrors and/or imaging optics, to form a disk laser. The laser disk module 100 includes a lasing element 102, containing active gain medium. The lasing element 102 has opposite top 103 and bottom 105 end surfaces.

In some implementations, the top end surface 103 and the bottom end surface 105 can be substantially parallel to each other. The lasing element 102 has a thickness, T, between the top end surface 103 and the bottom end surface 105 along a longitudinal direction 101 perpendicular to the top end surface 103 or the bottom end surface 105. In some implementations, the top end surface 103 and the bottom end surface 105 can be wedged relative to each other at an angle, e.g., about 0.1 degree.

The active gain medium in the lasing element 102 can include ytterbium-doped gain crystals, e.g., Yb:YAG, Yb:LuAG, tungstate crystals (Yb:KGW, Yb:KYW, Yb:KLuW), Yb:LaSc$_3$(BO$_3$)$_4$ (Yb:LSB), Yb:CaGdAlO$_4$ (Yb:CALGO), Yb:YVO$_4$, Yb:Sc$_2$O$_3$, Yb:Lu$_2$O$_3$, or Yb:Y$_2$O$_3$. Alternatively, other laser gain media besides Yb can be used, such as neodymium (Nd) (e.g., Nd:YAG and Nd:YVO$_4$), thulium (Tm), holmium (Ho), erbium (Er) or chromium (Cr). Instead of thin disk laser crystals, other active gain mediums like semiconductors, e.g., vertical external cavity surface-emitting lasers (VECSELs) or edge emitter lasers mediums can also be used.

For illustration, described here is thin disk crystals as active gain medium. To form an optical resonator cavity for the active gain medium, the lasing element 102 can be coated with a high-reflectivity (HR) mirror 110, e.g., a HR layer with 100% reflectivity, on the bottom end surface 105. In some implementations, the lasing element 102 can be coated with a partially reflective mirror 108, e.g., an anti-reflectivity (AR) layer, on the top end surface 103, which is used as an output coupler for the disk laser 100.

In some implementations, the lasing element 102 is not coated with the partially reflective mirror 108. Instead, an external reflective configuration is positioned in front of the lasing element 102 to form the optical resonator cavity with the high-reflectivity mirror 110, e.g., along the longitudinal direction 101. The external reflective configuration can include one or more reflective mirrors. In a particular configuration, the external reflective configuration includes one or more high-reflectivity mirrors and a partially reflective mirror as an output coupler. The partial reflective mirror can be positioned along the longitudinal direction 101 or positioned at an angle to the longitudinal direction 101. The partial reflective mirror can include an anti-reflective coating to suppress interaction of the top end surface 103 with pump light and laser light radiation.

A pump light 112 can be incident on the top end surface 103 of the lasing element 102 through the external reflective configuration or the partially reflective mirror 108. The pump light 112 can be repeatedly reflected back towards the active gain medium, e.g., by the external reflective configuration and/or imaging optics, thereby achieving sufficient pump light absorption. Emitted laser light resonates within the optical resonator cavity, thereby amplifying the laser light, some of which is passed through the external reflective configuration or the partially reflective mirror 108 and becomes an output laser light 114. In some cases, the partial reflective mirror in the external reflective configuration is positioned angled to the longitudinal direction 101, and the output laser light 114 accordingly propagates angled to the laser disk module 100.

The partially reflective mirror 108 or the partial reflective mirror in the external reflective configuration can have minimal reflectivity at both pump and laser light wavelengths. The high-reflectivity mirror 110 can provide high reflectivity with respective to both the pump and laser light wavelength. In some examples, the high-reflectivity mirror 110 is a dielectric coating that includes alternating multilayers of dielectric materials with higher and lower refractive indices, e.g., $TiO_2$ and $SiO_2$, or $Ta_2O_5$ and $SiO_2$. The high-reflectivity mirror 110 can be deposited onto the bottom end surface 105 of the lasing element 102 via suitable deposition processes, e.g., thermal evaporation, ion beam sputtering, or chemical vapor deposition.

The lasing element 102 can have a planar curvature, a concave curvature, or any suitable types of curvature. The lasing element 102 can also have any desired shape, e.g., circular or rectangular.

The lasing element 102 can be a thin crystal disk with a smaller thickness T relative to a larger transverse size L (T and L are illustrative but not in scale in FIG. 1). The thickness T can be defined by the top 103 and bottom 105 end surfaces of the lasing element 102 along the longitudinal direction 101. The thickness T can be, for example, on an order of approximately 100 µm, e.g., from about 50 µm to 1000 µm. The transverse size L can be, for example, on an order of approximately 10 mm, e.g., from about 5 mm to 30 mm. The increase in the transverse size L allows an output power of the disk laser 100 scaling to a few hundred watts, kilowatts or megawatts.

Heat can be generated in the lasing element 102 during operation of the laser disk module 100, particularly when the output power is high. As the lasing element 102 is very thin, the generated heat is substantially drawn or extracted from a direction perpendicular to a plane of the lasing element 102, e.g., from the longitudinal direction 101. In some cases, it is preferable to cool from a bottom side of the lasing element 102, which obviates any optical requirements for a cooling device. Heat is therefore drawn through the bottom end surface 105 or the high-reflectivity mirror 110.

The lasing element 102 can be cooled by a heat transfer element 104 positioned adjacent the bottom end surface 105 or the high-reflectivity mirror 110 along the longitudinal direction 101. The heat transfer element 104 is configured to transfer heat generated in the lasing element 102 to a coolant interacting with the heat transfer element 104 during the operation of the laser disk module 100.

In some examples, the coolant is directly jet impinged onto the heat transfer element 104, e.g., by standard-impingement or micro-impingement cooling in multiple jets. Heat is locally (and/or radially) transferred from the heat transfer element to the coolant. In some examples, the laser disk module 100 includes a cooling cavity 106 coupled to the heat transfer element 104. During the operation of the laser disk module 100, the coolant can be circulated through a coolant supply conduit 107 into the cooling cavity 106 and to the heat transfer element 104, and the heated coolant is circulated from the heat transfer element 104 to the cooling cavity 106 to a coolant return conduit 109.

The coolant supply conduit 107 and the coolant return conduit 109 can each include a cooling liquid piping system.

The coolant can be chilled fluid (e.g., a chilled water) from a chiller plant, free cooling facility, or other mechanical refrigeration device, chilled glycol, an evaporatively-cooled fluid, cooling fluid from water, refrigerant liquid, liquid nitrogen, or otherwise.

To enable effective cooling, the heat transfer element 104 can be configured to meet one or more criteria of: 1) large thermal conductivity; 2) matching of coefficient of thermal expansion (CTE) of material of the heat transfer layer 104 with the active gain medium to a certain degree, e.g., within a factor of 2 or within a factor of 10-20%; 3) mechanical robustness and ability to support the lasing element 102 and/or to prevent liquid coolant from impinging on and degrading the high-reflectivity mirror or the active gain medium; 4) small coolant resistance for high coolant flowing rate; and 5) small thermal resistance for high heat transfer rate. Further, it is preferable that the heat transfer element 104 and/or a method of bonding the heat transfer element 104 to the lasing element 102 are cost effective. In some implementations, the heat transfer element 104 can be configured without CTE matching with the active gain medium.

In a particular example, the active gain medium of the lasing element 102 is Yb:YAG. The Yb:YAG has a CTE of about $7.7$-$8.2 \times 10^{-6}/^\circ$ C. A preferable material for the heat transfer element 104 can be a ceramic material, such as aluminum nitride (AlN). The AlN has a CTE of more than $4.0 \times 10^{-6}/^\circ$ C., e.g., about $4.5 \times 10^{-6}/^\circ$ C., which is closer to the CTE of Yb:YAG than a diamond with a CTE of about $1.0 \times 10^{-6}/^\circ$ C. The AlN also has a high thermal conductivity of about 180-230 W/(m·K) and a high mechanical strength. Besides Yb:YAG, the AlN based heat transfer element can be also used for other active gain media, other disk lasers or semiconductor lasers. Besides the AlN material, other suitable ceramic materials can be also used for the heat transfer element 104, e.g., crystalline sapphire ($Al_2O_3$), silicon carbide (SiC) or boron nitride (BN), beryllium oxide, or any suitable type of ceramic material.

The heat transfer element 104 can include a heat transfer front side thermally coupled to the bottom end face 105 or the high-reflectivity mirror 110 and a heat transfer back side for interacting with the coolant. Effective coupling between the lasing element 102 and the heat transfer element 104 can be achieved to maximize heat transfer and coupling between the lasing element 102 and the heat transfer element 104. Adjustment tools can be also used to fine tune the coupling, e.g., at an order of nanometers.

In some implementations, the heat transfer front side and the bottom end face 105 or the high-reflectivity mirror 110 are coupled together by bonding such as adhesive bonding (e.g., by glue or welding flux), chemical assisted bonding, gluing, or any other suitable bonding techniques, welding or soldering (e.g., by using solders such as gold-tin solder Au80Sn20), or mounting with indium. In some implementations, the heat transfer element 104 is sintered and then the lasing element 102 is mounted onto the heat transfer element 104. In some implementations, the heat transfer front side and the bottom end face 105 or the high-reflectivity mirror 110 are coupled together by direct bonding or direct laser welding.

In a particular example, the heat transfer element 104 made of AlN material is attached to the high reflectivity mirror 110 coated on the bottom end surface 105 of the lasing element 102. The high reflectivity mirror 110 can be alternating layers of $Ta_2O_5$ and $SiO_2$.

As noted above, the lasing element 102 can have a planar curvature, a concave curvature, or any suitable type of curvature. The heat transfer element 104 can be configured to have a corresponding planar curvature or concave curvature such that the lasing element 102 can be mostly or completely in contact with the heat transfer element 104. In some examples, the heat transfer front side of the heat transfer element 104 has the corresponding curvature to the lasing element 102, and the heat transfer back side of the heat transfer element 104 can have a suitable curvature (e.g., planar) for the coolant.

To effectively cool the entire area of the lasing element 102, the heat transfer element 104 can have a substantially same or larger surface area than an area of the bottom end surface 105 or the high-reflectivity mirror 110. In a particular example, when the lasing element 102 is a circular disk, the heat transfer element 104 can be a circular layer with a diameter substantially same or larger than the lasing element 102.

The heat transfer element 104 can be configured to have a targeted thickness. On one hand, the thickness of the heat transfer element 104 can be as thin as possible to enable minimum thermal resistance for efficient heat transfer between the lasing element 102 and the coolant. On the other hand, the thickness of the heat transfer element 104 meets necessary mechanical robustness and stiffness. In a particular example, the heat transfer element 104 has a thickness of between about 100 μm and 10 mm.

The heat transfer element 104 can be a support layer for the lasing element 102. On one hand, the support layer is configured to provide enough mechanical robustness and ability to support the lasing element 102. On the other hand, the support layer is configured to transfer heat generated in the lasing element 102 to a coolant, e.g., a cooling fluid.

In some implementations, the heat transfer element 104 is a monolithic thin flat plate made of a ceramic material. In some implementations, the heat transfer element 104 includes a thin flat plate on the heat transfer front side and a fin-like structure on the heat transfer back side.

In some implementations, the heat transfer element 104 includes a number of cooling structures, e.g., hollow structures or hollow channels, within the heat transfer element 104. The heat transfer element 104 is configured to transfer heat generated in the lasing element 102 to a coolant interacting with the heat transfer element 104 through the cooling structures during the operation of the laser disk module 100.

As noted above, a preferable ceramic material for the heat transfer element 104 can be AN material that can be used to form a number of channels. The channels can include microchannels and/or nanochannels, that is, the channel widths can be on the order of micrometers and/or nanometers. In some examples, the channels can have a size of about millimeters, e.g., 1 mm in width or height. The channels can be configured to enable radial heat flow (e.g., with straight channels) or even heat flow (e.g., with adapted channel widths).

The number of cooling structures in the heat transfer element 104 are configured to provide one or more of features: 1) a large inner surface area to improve interaction between the coolant and the ceramic material of the heat transfer element, thereby improving heat exchange between the coolant and the ceramic material thus the active gain medium; 2) small coolant resistance for high coolant flowing rate thus high heat transfer rate; and 3) thin effective thickness thus small thermal resistance for the heat transfer element than a planar heat transfer layer. In some examples, the number of cooling structures in the heat transfer element 104 has a total inner surface area substantially larger than an interaction area between the heat transfer element 104 and the bottom end surface 105 or the high-reflectivity mirror 110.

The cooling structure or channel pattern of the ceramic material in the heat transfer element 104 can be designed to include the features described above to achieve maximum inner surface area, minimum coolant resistance, thinnest effective thickness, minimum thermal resistance, and/or maximum cooling power. In some implementations, the heat transfer element can have a cooling power at an order of 100 W/cm$^2$ to 1000 W/cm$^2$. The channel structure can be designed by simulation, e.g., by computer-based finite element method (FEM) modeling.

The heat transfer element 104 can have any suitable channel pattern, structure, and/or configuration, e.g., a spiral cooling channel, a start type channel. In some implementations, as noted above, the heat transfer element 104 can include hollow structures used for impingement cooling, e.g., multiple-jet micro-impingement cooling, where the coolant is impinged onto or into the hollow structures within the heat transfer element 104 in multiple jets and the heat is locally and radially transferred from the heat transfer element 104 to the coolant. In some implementations, the heat transfer element 104 includes a foam-like cooling layer (or a sponge-like cooling layer) that defines the number of cooling structures. The foam-like cooling layer can contain the coolant in the cooling structures for effective cooling.

In some implementations, the heat transfer element 104 can be an integral piece made by monolithic growth. In some implementations, the heat transfer layer 104 can be fabricated based on sintering. In some implementations, the heat transfer element 104 includes a plurality of layers that define a number of channels when the layers are joint together. Each layer can be fabricated separately and then bonded together. As described in further details below, FIGS. 2A-2C and FIGS. 3A-3F show two example heat transfer layers with respective channels or structures, e.g., based on simulation.

Figure 2B:
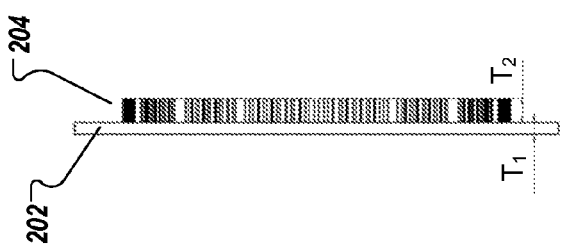
FIG. 2B depicts a side view of the heat transfer element of FIG. 2A.
Figure 2C:
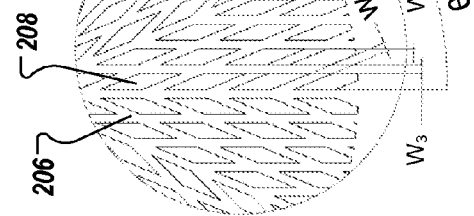
FIG. 2C depicts an enlarged view of part of the heat transfer element of FIG. 2A.
Figure 2A:
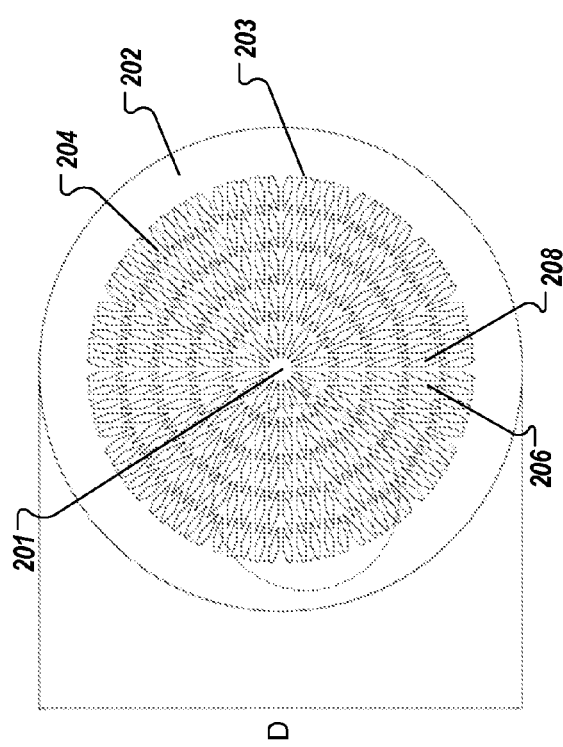
FIG. 2A depicts an example heat transfer element with multiple channels.

Referring to FIGS. 2A-2C, an example heat transfer element 200 with multiple channels is illustrated. The heat transfer element 200 can be attached to a lasing element, e.g., the lasing element 102 of FIG. 1, to form a laser disk module of a disk laser, e.g., the laser disk module 100 of FIG. 1. The heat transfer element 200 can be used in impingement cooling or with cooling supply, e.g., the cooling cavity 106 of FIG. 1.

FIGS. 2A and 2B depict top and side views of the heat transfer element 200. FIG. 2C depicts an enlarged view of part of the heat transfer element of FIG. 2A. The heat transfer element 200 can be used as the heat transfer element 104 of FIG. 1. The heat transfer element 200 can be made of a ceramic material such as AN. The heat transfer element 200 can have any suitable shape or curvature. For purpose of illustration, the heat transfer element 200 has a circular shape and a planar curvature.

The heat transfer element 200 includes a front layer 202 and a back layer 204 positioned along a longitudinal direction, e.g., the longitudinal direction 101 of FIG. 1. The front layer 202 can be the heat transfer front side of the heat transfer element 104 of FIG. 1, which is attached to the lasing element. The front layer 202 can be a flat solid plate without channels such that a coolant does not impinge on or into the lasing element and/or degrade active gain medium of the lasing element or a high-reflectivity coating on the lasing element. The front layer 202 also provides supporting to the lasing element.

The back layer 204 can be the heat transfer back side of the heat transfer element 104 of FIG. 1. The back layer 204 also provides supporting to the lasing element. The back layer 204 is constructed to include a number of channels for interacting with the coolant. The channels can be open to a bottom surface of the front layer 202, e.g., vertically along the longitudinal direction. The coolant can flow to the bottom surface of the front layer 202 through multiple passages defined in the channels.

During operation of the laser disk module, the coolant, e.g., a cooling liquid, can be impinged onto the bottom surface of the front layer 202 through the channels vertically along the longitudinal direction, such that the coolant can be in direct contact with the front layer 202 for efficient transferring heat generated from the lasing element. The coolant can be circulated in the channels and in a direct contact with the back layer 204 for heat transfer.

The front layer 202 can have a larger diameter D than the back layer 204, and the back layer 204 can have a substantially same or larger diameter than the lasing element. The front layer 202 can have a thinner thickness than the back layer 204. In a particular example, the diameter D of the front layer 202 is about 20 mm. The front layer 202 has a thickness $T_1$ of about 0.5 mm, and the back layer 204 has a thickness $T_2$ of about 1.0 mm.

The front layer 202 and the back layer 204 can be an integral piece fabricated by, for example, sintering. In some cases, the front layer 202 and the back layer 204 are separately fabricated and joint together by effective bonding, e.g., direct bonding or glue bonding.

As illustrated in FIG. 2A, the number of channels in the back layer 204 are radially and/or symmetrically distributed between a center 201 and a peripheral edge 203 of the heat transfer element 200. Solid parts 208 of the heat transfer element 200 that include the ceramic material define the channels 206 of the heat transfer element 200 that are hollow.

Each solid part 208 can have a rhombus shape that defines an acute angle θ between first and second adjacent sides and a width $W_1$ between two parallel sides of the rhombus shape. Each solid part 208 has a first channel gap $W_2$ with an adjacent solid part along the first adjacent side, and a second channel gap $W_3$ with another adjacent solid part along the second adjacent side. In a particular example, each solid part 208 defines an acute angle of about 22.5 degree, and has a width $W_1$ of about 0.37 mm, a first channel gap $W_2$ of about 0.20 mm and a second channel gap $W_3$ of about 0.20 mm.

FIGS. 3A-3F illustrate another example heat transfer element 300 with multiple channels. FIGS. 3A and 3B depict top and side views of the heat transfer element 300, respectively. FIGS. 3C and 3D depict exploded side and perspective views of layers of the heat transfer element 300, respectively. FIGS. 3E and 3F depict enlarged views of part of layers of the heat transfer element 300 of FIG. 3A, respectively. The heat transfer element 300 can be used as the heat transfer element 104 of FIG. 1. The heat transfer element 300 can include a ceramic material such as AN. For purposes of illustration, the heat transfer element 300 has a circular shape and a planar curvature.

The heat transfer element 300 can include an arbitrary number of adjacent layers, e.g., three layers, five layers, or ten layers. For illustration, the heat transfer element 300 includes three adjacent layers 310, 320 and 330. The first layer 310 can be the heat transfer front side of the heat transfer element 104 of FIG. 1 or the front layer 202 of FIGS. 2A-2C. The first layer 310 is coupled to a lasing element, e.g., the lasing element 102 of FIG. 1, of a laser disk module of a disk laser, e.g., the laser disk module 100 of FIG. 1 The first layer 310 can be a solid plate and does not have channels or holes inside. The second layer 320 and the third layer 330 can individually include a number of channels. The second layer 320 can include azimuthally distributed rims 328 for connecting the channels to a peripheral edge 322 of the second layer 320. The third layer 330 can include azimuthally distributed rims 338 for connecting the channels to a peripheral edge 332 of the third layer 330.

The centers 311, 321 and 331 of the three layers 310, 320 and 330 are coaxial along a longitudinal direction perpendicular to the transverse planes of the layers. The three adjacent layers 310, 320 and 330 can have a substantially same diameter D. In a particular example, the diameter D is about 20 mm.

The three adjacent layers 310, 320 and 330 can have a total thickness T. In a particular example, the thickness T is about 0.9 mm. In some examples, the three layers 310, 320 and 330 have a substantially same thickness. In some examples, the first layer 310 has a thinner thickness than the second and third layers 320 and 330, respectively.

Similar to the heat transfer element 200, the three adjacent layers 310, 320 and 330 of the heat transfer element 300 can be an integral piece fabricated by, for example, sintering. In some cases, the three layers 310, 320 and 330 are separately fabricated and joint together by effective bonding, welding or soldering, or mounting.

The second layer 320 and the third layer 330 can have different channel structures. The second layer 320 includes a number of second channels that are radially and/or symmetrically distributed between the center 321 and the peripheral edge 322 of the second layer 320. The second channels can be open to a bottom surface of the first layer 310, e.g., vertically along the longitudinal direction. The coolant can flow to the bottom surface of the first layer 310 through multiple passages defined in the second channels.

During operation of the laser disk module or the disk laser, the coolant, e.g., a cooling liquid, can be impinged onto the bottom surface of the first layer 310 through the second channels, e.g., vertically along the longitudinal direction, such that the coolant can be in direct contact with the first layer 310 for efficient transferring heat generated from the lasing element. The coolant can be circulated in the second channels and in a direct contact with the second layer 320 for heat transfer.

The third layer 330 includes a number of third channels that are radially and/or symmetrically distributed between the center 331 and the peripheral edge 332 of the third layer 330. The third channels 330 can cross over the second channels 320 and be configured to permit a coolant to flow freely between the second channels and the third channels during operation of a laser disk module or a disk laser having the heat transfer element 300. The third channels 330 can be open to the second layer 320, e.g., vertically along the longitudinal direction. The coolant can flow to the bottom surface of the first layer 310 through multiple passages defined in the second channels and the third channels.

During the operation of the laser disk module or the disk laser, the coolant can be impinged onto the bottom surface of the first layer 310 through the second channels and the third channels, e.g., vertically along the longitudinal direction, such that the coolant can be in direct contact with the first layer 310 for efficient transferring heat generated from the lasing element. The coolant can be circulated in the second channels and the third channels and in direct contact with the second layer 320 and the third layer 330 for heat transfer.

In some implementations, solid parts 324 of the second layer 320 that include the ceramic material define the channels 326 of the second layer 320 that are hollow. Each channel 326 has a first arrow shape defining an acute angle $\theta_2$ between two adjacent sides and a channel width W21 on one side and W22 on the other side. The acute angle $\theta_2$ of the first arrow shape points to the center 321 of the second layer 320.

In some implementations, solid parts 334 of the third layer 330 that include the ceramic material define the channels 336 of the third layer 330 that are hollow. Each channel 336 has a second arrow shape defining an acute angle $\theta_3$ between two adjacent sides and a channel width W31 on one side and W32 on the other side. The acute angle $\theta_3$ of the second arrow shape of the third layer 330 points to the peripheral edge 332 of the third layer 330.

In a particular example, each channel 326 of the second layer 320 has an acute angle $\theta_2$ of about 22.5 degree, a channel width $W_{21}$ of about 0.2 mm, and a channel width $W_{22}$ of about 0.2 mm. Each channel 336 of the third layer 330 has an acute angle $\theta_3$ of about 22.5 degree, a channel width W31 of about 0.2 mm, and a channel width $W_{32}$ of about 0.2 mm.

In some implementations, the two layers with channels are exchangeable in the heat transfer element 300. For example, the third layer 330 can be positioned between the first layer 310 and the second layer 320. In some implementations, the heat transfer element 300 includes two layers, e.g., the first layer 310 and the second layer 320, the first layer 310 and the third layer 330, or the second layer 320 and the third layer 330. In some implementations, the heat transfer element 300 includes one layer, e.g., the first layer 310, the second layer 320, or the third layer 330.

While this specification contains many specific implementation details, these should not be construed as limitations on the scope of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Thus, particular embodiments of the subject matter have been described. Other embodiments are within the scope of the following claims.

What is claimed is:

1. A laser disk module comprising:
 a lasing element including an active gain medium, the lasing element including opposite top and bottom end surfaces; and
 a heat transfer element adjacent the bottom end surface, the heat transfer element including a ceramic material that defines a plurality of cooling structures,
 wherein the heat transfer element is configured to transfer heat generated in the lasing element to a coolant in contact with the heat transfer element in the plurality of cooling structures during operation of the laser disk module, and
 wherein the plurality of cooling structures is radially distributed between a center of the heat transfer element and a peripheral edge of the heat transfer element, the cooling structures including a plurality of solid parts that define a plurality of channels, each of the solid parts having a rhombus shape defining an acute angle.

2. The laser disk module of claim 1, wherein the bottom end surface of the lasing element is deposited with a high-reflectivity coating configured to form a laser cavity with an external reflective configuration positioned in front of the top bottom end surface, the laser cavity being part of a thin disk laser or a semiconductor laser.

3. The laser disk module of claim 1, wherein the active gain medium includes ytterbium doped yttrium aluminum garnet (Yb:YAG) or lutetium aluminum garnet (Yb:LuAG).

4. The laser disk module of claim 1, wherein the ceramic material includes aluminum nitride (AlN).

5. The laser disk module of claim 1, wherein the heat transfer element has a thickness of between about 100 µm and 10 mm.

6. The laser disk module of claim 1, wherein the plurality of cooling structures has a total inner surface area substantially larger than an interaction area between the heat transfer element and the bottom end face of the lasing element.

7. The laser disk module of claim 1, wherein the acute angle is about 22.5 degree defined by two adjacent sides of the solid part, and a channel width is about 0.2 mm defined by adjacent sides of the solid part and adjacent solid part.

8. The layer disk module of claim 1, wherein each channel has one of an arrow shape defining an acute angle pointing to the center of the heat transfer element or an arrow shape defining an acute angle pointing to the peripheral edge of the heat transfer layer.

9. The laser disk module of claim 8, wherein each channel has an acute angle of about 22.5 degree defined by two adjacent sides of the channel and a channel width of about 0.2 mm defined by two parallel sides of the channel.

10. The laser disk module of claim 1, further comprising a cooling cavity coupled to the heat transfer element, wherein, during the operation of the laser disk module, the coolant is circulated through a coolant supply conduit into the cooling cavity and into the cooling structures, and the heated coolant is circulated from the cooling structures to the cooling cavity to a coolant return conduit.

11. The laser disk module of claim 1, wherein the heat transfer element is configured such that the coolant is micro-impinged onto the cooling structures in multiple jets, the heat being locally and radially transferred from the heat transfer element to the coolant.

12. The laser disk module of claim 1, wherein the heat transfer element includes a heat transfer front side thermally coupled to the back end face of the lasing element and a heat transfer back side for interacting with the coolant, the plurality of cooling structures being within the heat transfer back side.

13. The laser disk module of claim 12, wherein the heat transfer front side and the back end face of the lasing element are coupled together by at least one of bonding, soldering, welding, or mounting.

14. The laser disk module of claim 1, wherein the heat transfer element includes a plurality of layers that forms the plurality of cooling structures when the layers are joint together.

15. The laser disk module of claim 14, wherein the plurality of layers includes:
 a first layer adjacent the back end face of the lasing element, the first layer being a solid plate; and
 a second layer adjacent the first layer, the second layer including a plurality of second channels that is radially distributed between a center of the second layer and a peripheral edge of the second layer.

16. A laser disk module comprising:
 a lasing element including an active gain medium, the lasing element including opposite top and bottom end surfaces; and
 a heat transfer element adjacent the bottom end surface, the heat transfer element including a ceramic material that defines a plurality of cooling structures,
 wherein the heat transfer element is configured to transfer heat generated in the lasing element to a coolant in contact with the heat transfer element in the plurality of cooling structures during operation of the laser disk module, wherein the heat transfer element includes a plurality of layers that forms the plurality of cooling structures when the layers are joint together, wherein the plurality of layers includes:
- a first layer adjacent the back end face of the lasing element, the first layer being a solid plate; and
- a second layer adjacent the first layer, the second layer including a plurality of second channels that is radially distributed between a center of the second layer and a peripheral edge of the second layer, wherein the plurality of layers further includes: a third layer adjacent the second layer, the third layer including a plurality of third channels that is radially distributed between a center of the third layer to a peripheral edge of the third layer, the third channels crossing over the second channels and being configured to permit the coolant to flow freely between the second channels and the third channels during the operation of the laser disk module, wherein each channel of the second channels has a first arrow shape defining a first acute angle pointing to the center of the second layer, and each channel of the third channels has a second arrow shape defining a second acute angle pointing to the peripheral edge of the third layer, and wherein the centers of the first, second and third layers are coaxial and the first, second and third layers have a substantially same diameter.

17. The laser disk module of claim 1, wherein the heat transfer element includes a foam-like configuration that defines the plurality of cooling structures.

18. A thin disk laser module comprising:
- a thin crystal disk of active gain medium, the thin crystal disk including opposite top and bottom end surfaces that define a thickness therebetween along a longitudinal direction substantially perpendicular to the bottom end surface; and
- a heat transfer element adjacent the thin crystal disk along the longitudinal direction, the heat transfer element being made of a ceramic material, the heat transfer element including:
  - a heat transfer front side coupled to the bottom end surface of the thin crystal disk, the heat transfer front side including a solid plate; and
  - a heat transfer back side including a plurality of cooling structures that are open to a bottom surface of the heat transfer front side along the longitudinal direction, wherein the heat transfer element is configured to transfer heat generated in the thin crystal disk to a cooling fluid in a direct contact with the bottom surface of the heat transfer front side and with the heat transfer back side in the plurality of cooling structures during operation of the thin disk laser module, and wherein the plurality of cooling structures is radially distributed between a center of the heat transfer element and a peripheral edge of the heat transfer element, the cooling structures including a plurality of solid parts that defines a plurality of channels, each of the solid parts having a rhombus shape defining an acute angle.

* * * * *

UNITED STATES PATENT AND TRADEMARK OFFICE
CERTIFICATE OF CORRECTION

PATENT NO.         : 9,337,614 B1
APPLICATION NO.    : 14/520592
DATED              : May 10, 2016
INVENTOR(S)        : Killi et al.

Page 1 of 1

It is certified that error appears in the above-identified patent and that said Letters Patent is hereby corrected as shown below:

In the Claims

In column 12, line 15, Claim 8, delete "layer" and insert --laser--.

Signed and Sealed this
Ninth Day of August, 2016

Michelle K. Lee
*Director of the United States Patent and Trademark Office*